United States Patent [19]

Cha

[11] Patent Number: 5,334,873
[45] Date of Patent: Aug. 2, 1994

[54] SEMICONDUCTOR PACKAGES WITH CENTRALLY LOCATED ELECTRODE PADS

[75] Inventor: Gi Bon Cha, Kyungki-Do, Rep. of Korea

[73] Assignee: Goldstar Electron Co., Ltd., Choongchungbook-Do, Rep. of Korea

[21] Appl. No.: 872,154

[22] Filed: Apr. 22, 1992

[30] Foreign Application Priority Data

May 11, 1991 [KR] Rep. of Korea ............... 7631/1991

[51] Int. Cl.$^5$ ............................................. H01L 23/02
[52] U.S. Cl. ............................. 257/666; 257/673; 257/738; 257/787
[58] Field of Search ............ 257/780, 737, 738, 772, 257/786, 763, 764, 666, 673, 787

[56] References Cited

U.S. PATENT DOCUMENTS

| | | | |
|---|---|---|---|
| 3,947,867 | 3/1976 | Duffek et al. | 257/738 |
| 4,604,644 | 8/1986 | Beckham et al. | 257/737 |
| 4,796,078 | 1/1989 | Phelps, Jr. et al. | 257/786 |
| 5,109,265 | 4/1992 | Utesch et al. | 257/786 |
| 5,155,578 | 10/1992 | Lim et al. | 257/786 |

*Primary Examiner*—William Mintel
*Assistant Examiner*—Roy Potter
*Attorney, Agent, or Firm*—Scully, Scott, Murphy & Presser

[57] ABSTRACT

A semiconductor package and a method for manufacturing such a package in which a desired thickness of the package is accomplished. The package includes a semiconductor chip provided with a plurality of solders which are formed on pads of the chip, respectively, and a plurality of inner leads of a lead frame which are electrically connected to the solders by soldering. The method comprises the steps of coating polyimide layers on a surface of semiconductor chip, forming solders on pads of the chip, soldering inner leads of a lead frame to the solders in order to electrically connect the chip to the inner leads, molding an encapsulation epoxy resin coating in order to cover a predetermined area including the semiconductor chip and the inner leads, and trimming and forming the package having been processed in above steps. The package of this invention provides advantage in that the inner leads are connected to the solders of the chip, thereby accomplishing a desired thickness of the package, reducing manufacturing cost and simplifying the manufacturing process of the package due to removing wires.

7 Claims, 5 Drawing Sheets

SEMICONDUCTOR PACKAGES WITH CENTRALLY LOCATED ELECTRODE PADS

BACKGROUND OF THE INVENTION

1. Filed of The invention

The present invention relates in general to a semiconductor package and a method for manufacturing such a package. Particularly, the present invention relates to a semiconductor package and a method for manufacturing such a package in which a semiconductor chip is connected to a plurality of inner leads of a lead frame having no paddle by means of soldering, thereby reducing the thickness of semiconductor package.

2. Description of the Prior Art

Recently, in correspondence with tendency of increasing the capacity of memory chip as the semiconductor techniques are substantially advanced, it is required to enclose a bare chip having a relatively huge size within a semiconductor package. Thus, the ratio of the area of the bare chip to the total area of the package is obliged to be increased.

Consequently, the increase of the relative area ratio mentioned above results in an increase in the volume of the semiconductor package, thereby inducing a problem in that a required size of the package can not be obtained.

Hence, there have been several efforts for solving the above problem, for example, an LOC (lead on chip) technique wherein leads are placed on the top of active semiconductor chip and, directly and electrically connected to the semiconductor chip. Here, a typical example of an SOJ (small outline J-lead) type of package according to the LOC technique will be described in conjunction with the accompanying drawings.

FIGS. 1 and 2 show a plane view of a wire bonding of a process for manufacturing the LOC-SOJ type of semiconductor package which is a representative example of 16MDRAM packages, and a sectional view showing a construction of a manufactured LOC-SOJ type of semiconductor package, respectively. As shown in the drawings, the LOC-SOJ type of package has a semiconductor chip 1 which is provided with insulating polyimide layers 2 coated on the opposite upper side surfaces thereof at a predetermined thickness throughout the whole length and width thereof. The chip 1 additionally includes a plurality of pads 3 each of which is electrically connected to an end of each inner lead 5 of a lead frame 4 through a wire 6 of which opposite ends are connected to the pad 3 and the inner lead 5, respectively. In addition, there is provided an epoxy resin layer 7 coated on a predetermined area including the chip 1 and the inner leads 5 of the frame 4 by a molding process.

In the drawings, the reference numerals, 5, 8 and 9, denote an outer lead of the lead frame, a damper and a support bar, respectively.

As described above, the LOC-SOJ type of package has an advantage in that it allows the inner leads 5 of the lead frame 4 to be pulled to an active cell of the semiconductor chip 1, thereby reducing the area wherein the inner leads 5 of the lead frame 4 occupy in the package.

However, the above LOC-SOJ type of package is obliged to be completely manufactured by an electric connection between the semiconductor chip 1 and the inner leads 5 of the lead frame 4 through the wires 5, thereby having a disadvantage in that it can only accomplish a limited thickness of the semiconductor package due to the electrical connection between the leads 5 and the chip 1.

In other words, a wire bonding is obliged to be performed for connecting the chip to leads in manufacturing the known semiconductor package, thus it is required to reduce a wire loop height as small as possible In order to accomplish the desired thickness. However, if the wire loop height is reduced as required, there may be a process and reliability problem such that the wire bonding is hard to achieve. In order to compensate such a problem, it is required both to select a wire material having a relatively higher strength sufficient for resisting the break of the wire and to develop a high quality wire bonding process to accomplish the reliable bonding of the wire.

Accordingly, it is inevitable that the known semiconductor package, for manufacturing a device where the wire bonding should be performed, is obliged to have a wire loop higher than the height of the inner lead 5 of the lead frame 4 irrespective of selected wire materials, thereby having a disadvantage in that it has an undesired substantial thickness.

SUMMARY OF THE INVENTION

It is, therefore, an object of the present invention to provide a semiconductor package and a method for manufacturing such a package in which the above disadvantage can be overcome.

It is another object of the present invention to provide a semiconductor package and a method for manufacturing such a package in which a plurality of inner leads of a lead frame are electrically connected to a semiconductor chip by soldering, thereby accomplishing a desired thickness of the package.

It is still another object of the present invention to provide a semiconductor package and a method for manufacturing such a package in which a conventional wire boding can be preferably omitted from the manufacturing process, thereby substantially reducing the manufacturing cost, simplifying the manufacturing process since several problems occurred by the wire bonding process can be removed.

In one aspect, the present invention provides a semiconductor package including a semiconductor chip provided with a plurality of solders which are formed on pads of the chip, respectively, and a plurality of inner leads of a lead frame, which are connected to the solders by soldering.

In another aspect, the present invention provides a method for manufacturing a semiconductor package including the steps of coating polyimide layers on a surface of the semiconductor chip, forming solders on pads of the chip, soldering inner leads of a lead frame to the solders in order to electrically connect the chip to the inner leads, molding an encapsulation epoxy resin coating in order to cover a predetermined area including the semiconductor chip and the inner leads, and trimming and forming the package having been processed in the above steps.

BRIEF DESCRIPTION OF THE DRAWINGS

The above and other objects, features and advantages of the present invention will be more clearly understood from the following detailed descriptions taken in conjunction with the accompanying drawings, in which.

DESCRIPTION OF THE PREFERRED EMBODIMENTS

Figure 1:
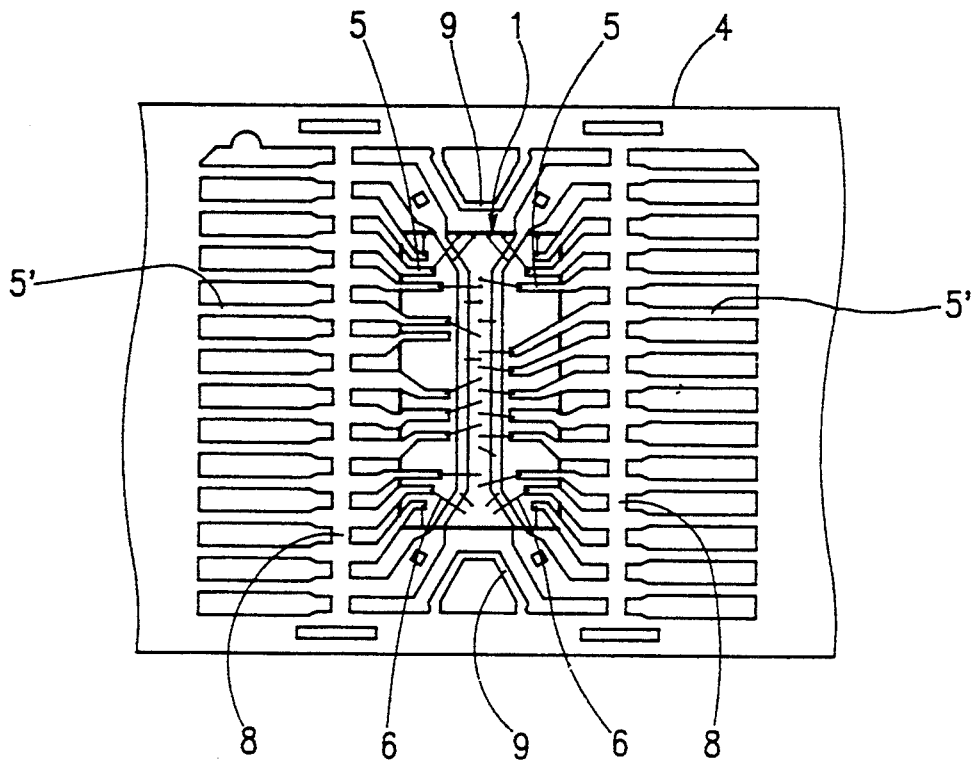
FIG. 1 is a plane view showing a wire bonding of a known manufacturing process of a semiconductor package in accordance with the prior art.
Figure 2:
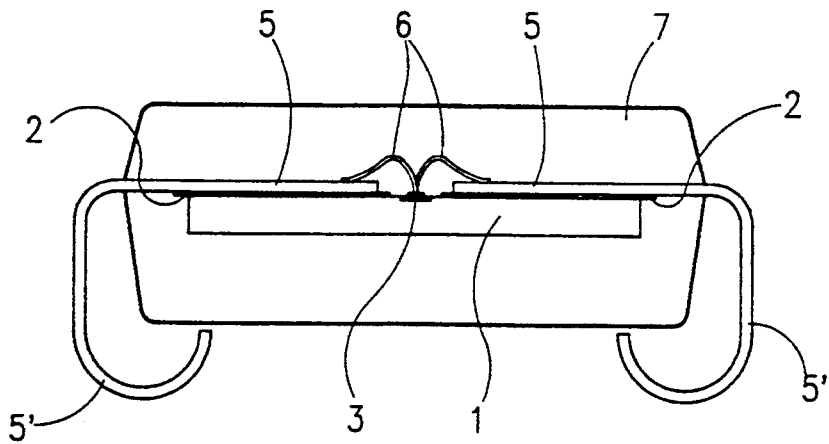
FIG. 2 is a cross sectional view showing a construction of a known semiconductor package In accordance with the prior art.
Figure 3:
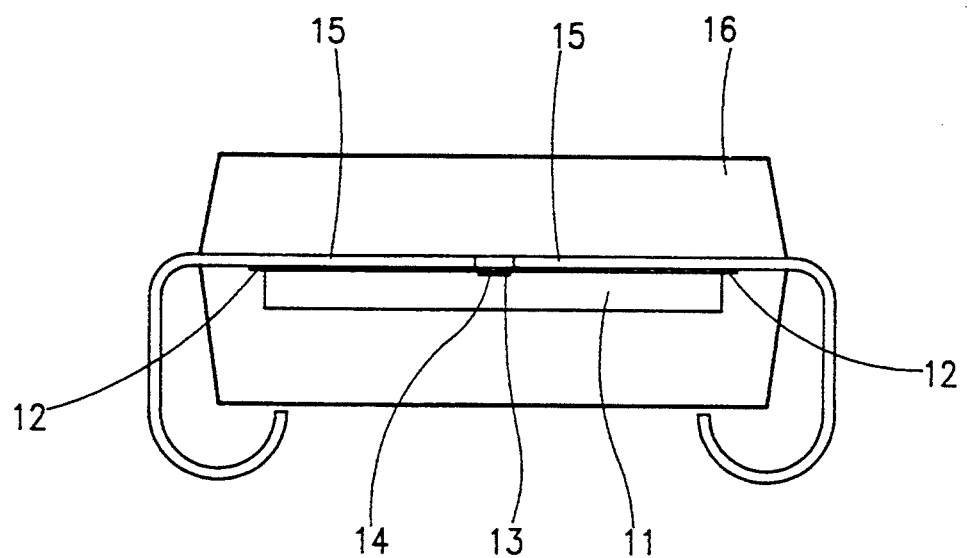
FIG. 3 is a view corresponding to FIG. 2, but showing the present invention.

With reference to FIG. 3 which is a cross sectional view showing a construction of an LOC-SOJ type of semiconductor package in accordance with the present invention, the package includes a semiconductor chip 11 having a pair of polyimide layers 12 which are coated on the upper side surfaces of the chip 11 in order to provide an insulating layer of a predetermined thickness. The chip 11 has a plurality of longitudinally disposed pads 13 on each of which a solder 14 is provided. Each solder 14 is connected to an end of an inner lead 15 of a lead frame by a soldering, preferably by a reflow soldering, thereby causing the chip 11 to be electrically connected to the inner leads 15. In addition, the semiconductor package including the chip 11 which is electrically connected to the inner leads 15 is then covered with an encapsulation epoxy resin layer 16 by a molding process so that a predetermined area of the package covering the semiconductor chip 11 and a part of each inner lead 15 is coated.

As described above, in the semiconductor package of this invention, the electrical connection between the inner leads 15 and the semiconductor chip 11 is accomplished by a soldering, such as a reflow soldering, instead of a conventional wire bonding, thereby preferably disregarding the wire loop height differently from the prior art, thus obtaining a reduced thickness of the package.

manufacturing the semiconductor package of this invention, it may be utilized a flip-chip soldering method wherein a chip is soldered upside down on a printed circuit board. The soldering method will be described in detail as follows.

The method generally includes several steps of a polyimide coating step wherein the semiconductor chip 11 is coated with a polyimide layer 12, a solder forming step wherein a solder 14 is provided on each pad 13 of the chip 11, a soldering step wherein the chip 11 is electrically connected to the inner leads 15 of the lead frame by soldering each inner lead 15 of the lead frame to each corresponding solder 14, a molding step wherein the encapsulation epoxy resin layer is applied to the predetermined area including the semiconductor chip 11 and a part of the inner leads 15 of the lead frame, and a conventional trimming/forming step.

Figure 4A:
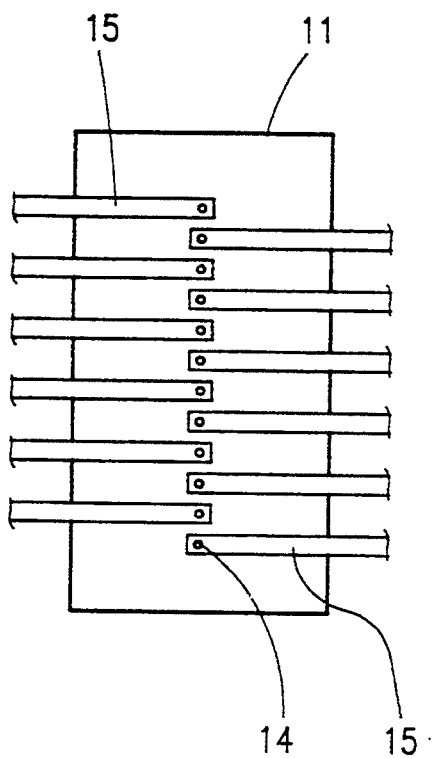
FIGS. 4A and 4B are a plane view and a cross sectional view showing a soldering step for manufacturing the package of FIG. 3, respectively.
Figure 4B:
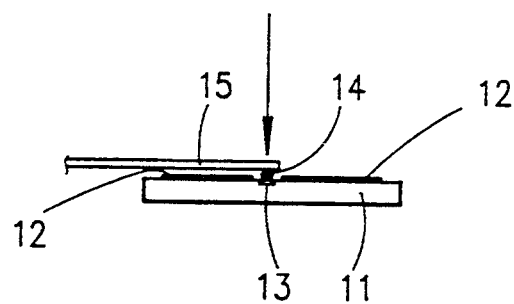

Of the above steps, the polyimide coating step, the molding step and the trimming/forming step are well known to a person skilled in the art, thus the detailed description of the above three steps will not be described for the simplicity. In result, the important steps of the manufacturing process of the semiconductor package of this invention, that is, the solder forming step and the soldering step will be described in detail in conjunction with FIGS. 4A and 4B which show an embodiment of a pad position in which the pads 13 of the chip 11 are disposed along a longitudinal line of a surface of the chip 11.

To provide the solders 14 on the pads 13 during the solder forming step, the chip 11 is first applied with a Cr/Cu/Au layer during a chip pad metallization, then coated with Pb-Sn alloys or any other solders of which melting temperature is higher than epoxy curing temperature, by an evaporation or a sputtering process or an electroplating process. Thereafter, the chip 11 having been provided with the Cr/Cu/Au layer and the solder coatings are temporarily heated at a predetermined temperature higher than a solder melting temperature in order to form ball type of solders 14 on the pads 13 by virtue of the surface tension of the melted alloys.

Thereafter, the chip 11 having been provided with the solders 14 is subject to the soldering step. In this soldering step, the inner leads 15 of the lead frame are approximately aligned with respect to the solders 14 of the chip 11, respectively. Thereafter, the chip 11 with respect to which the inner leads 15 are aligned is received in a joining furnace so as to be heated by increasing the temperature inside the furnace. As a result, the inner leads 15 of the lead frame are soldered to the solders 14, respectively, so as to be connected thereto. At this time, the inner leads 15 of the lead frame are preferably aligned with respect to the solders 14 of the chip 11 by virtue of a self-alignment so that the inner leads 15 of the package of this invention does not need to be precisely aligned with respect to the solders differently from the conventional flip-chip type of packages. Accordingly, the chip of the package is electrically connected to the inner leads 15 of the lead frame.

Figure 5A:
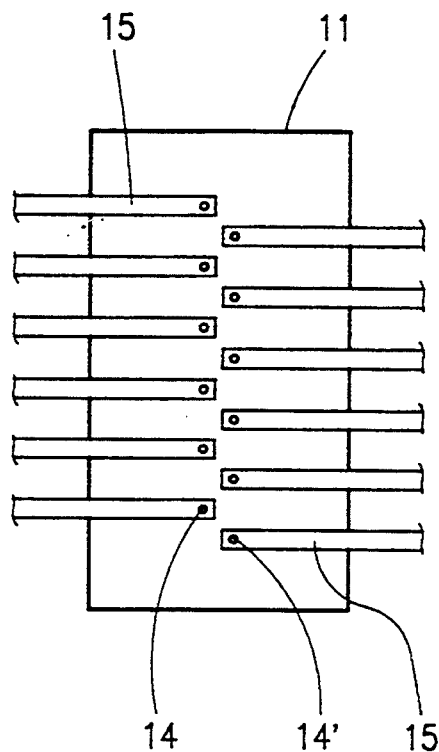
FIGS. 5A and 5B are a plane view and a cross sectional view showing another embodiment of a chip pad array of a semiconductor chip of the package of FIG. 3, respectively.
Figure 5B:
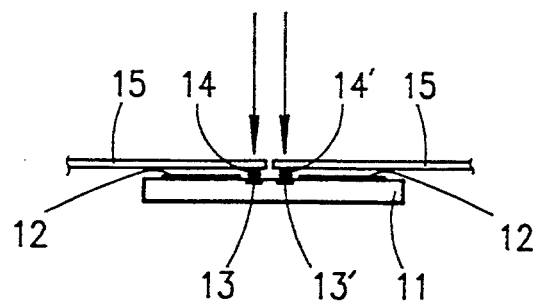
Figure 6:
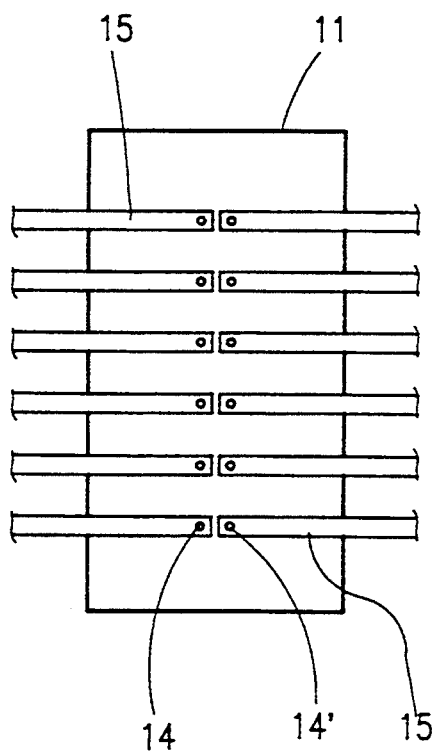
FIG. 6 is a view corresponding to FIG. 5A, but showing another embodiment.

Here, in performing the manufacturing process of this invention, if there may occur an overflow of the solder 14 such as due to intervals between the adjacent inner leads 15 of the lead frame during forming the solders 14, the pads 13 of the chip 11 are formed as being arranged along two longitudinal lines, respectively, in order to increase a lead pitch between the inner leads 15, thereby substantially removing the occurrence of the overflow.

in other words, two groups of pads 13 and 13' of the chip 11 are formed so as to be alternately, zigzag disposed as shown in FIGS. 5A and 5B, then provided with the solders 14 and 14' formed thereon, respectively, or the pads 13 and 13' are formed in parallel to each other, thereby facing to each other as shown in FIG. 6.

In other words, two groups of pads 13 and 13' of the about the SOJ type of package as a preferred embodiment, however, the present invention can be applied for various types of packages, besides the SOJ type of package, such as the SOP (small outline package) type, the MSP (mini square package) type, and the QFP (quad flat package) type of packages in which a soldering can be carried out.

As described above, the present invention provides a semiconductor package and a method for manufacturing the package in which inner leads of a lead frame can be connected to corresponding pads of a semiconductor chip by a soldering, thereby efficiently reducing the thickness of the package. Moreover, the present invention does not use a wire In manufacturing the package so that it provides another advantage in that it reduces the manufacturing cost and removes several problems, such as break of the wire, due to the wire bonding reliability.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A semiconductor package comprising:
    a semiconductor chip including an electric circuit and having an upper surface;
    a plurality of inner leads;
    a plurality of electrically conductive pads for connecting the inner leads to the electric circuit, and wherein the pads are disposed on a central, longitudinally extending area of the upper surface of the semiconductor chip and each of the inner leads extends directly over a respective, associated one of the pads;
    a plurality of solders, each of the inner pads having a respective one of the solders formed thereon, and each of the solders connecting a respective one of the inner leads to the associated one of the pads;
    an insulating film disposed on the upper surface of the semiconductor chip for preventing electrical interference between the inner leads and the electrical circuit of the semiconductor chip; and
    an encapsulating layer encapsulating the semiconductor chip and the inner leads.

2. A semiconductor package according to claim 1, wherein said solders are made of a Pb-Sn alloy.

3. A semiconductor package according to claim 2, wherein each of said solders has a ball-shape.

4. A semiconductor package according to claim 1, wherein said pads of the chip are disposed along two longitudinal lines of said chip and have said solders formed thereon.

5. A semiconductor package according claim 4, wherein the pads form a zig-zag pattern on the upper surface of the chip.

6. A semiconductor package according to claim 4, wherein said pads of the chip are disposed so as to be parallel to each other and have said solders formed thereon.

7. A semiconductor package according to Claim 1, wherein
    the encapsulating layer is made from an epoxy having an epoxy curing temperature; and
    said plurality of solders are made of a solder having a melting temperature higher than said epoxy curing temperature.

* * * * *

UNITED STATES PATENT AND TRADEMARK OFFICE
CERTIFICATE OF CORRECTION

PATENT NO. : 5,334,873
DATED : August 2, 1994
INVENTOR(S) : Gi Bon Cha

It is certified that error appears in the above-indentified patent and that said Letters Patent is hereby corrected as shown below:

Column 2, line 8: "In" should read --in--

Column 3, line 5: "In" should read --in--

Column 3, line 48: before "manufacturing" insert --In--

Column 4, line 37: after "chip" insert --11--

Column 4, line 47: "in" should read --In--

Column 4, line 54: delete "In other words, two groups of pads 13 and 13' of the" and insert --In the above description, there has been described--

Column 4, line 68: "In" should read --in--

Signed and Sealed this

Twenty-eight Day of February, 1995

Attest:

BRUCE LEHMAN

*Attesting Officer*    *Commissioner of Patents and Trademarks*